US011114350B2

United States Patent
Wu et al.

(10) Patent No.: US 11,114,350 B2
(45) Date of Patent: Sep. 7, 2021

(54) METHOD FOR REMOVING PHOTORESIST FROM PHOTOMASK SUBSTRATE

(71) Applicant: Applied Materials, Inc., Santa Clara, CA (US)

(72) Inventors: Banqiu Wu, San Jose, CA (US); Khalid Makhamreh, Los Gatos, CA (US); Eli Dagan, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/453,773

(22) Filed: Jun. 26, 2019

(65) Prior Publication Data

US 2020/0328128 A1 Oct. 15, 2020

Related U.S. Application Data

(60) Provisional application No. 62/833,469, filed on Apr. 12, 2019.

(51) Int. Cl.
*H01L 21/02* (2006.01)
*H01L 21/66* (2006.01)
*H01L 21/311* (2006.01)

(52) U.S. Cl.
CPC ........ *H01L 22/26* (2013.01); *H01L 21/02057* (2013.01); *H01L 21/31138* (2013.01)

(58) Field of Classification Search
None
See application file for complete search history.

(56) References Cited

U.S. PATENT DOCUMENTS

| | | |
|---|---|---|
| 6,279,249 B1 | 8/2001 | Dao et al. |
| 6,564,114 B1 * | 5/2003 | Toprac ................ C07K 14/195 216/59 |
| 6,594,847 B1 | 7/2003 | Krusell et al. |
| 6,693,043 B1 | 2/2004 | Li et al. |
| 6,908,567 B2 | 6/2005 | Uziel |
| 7,008,487 B1 | 3/2006 | Hedges et al. |

(Continued)

FOREIGN PATENT DOCUMENTS

WO 02015249 A2 2/2002

OTHER PUBLICATIONS

PCT Notification of Transmittal of the International Search Report and the Written Opinion of the International Searching Authority for International Application No. PCT/US2020/020739; dated Jun. 29, 2020; 13 total pages.

*Primary Examiner* — Mikhail Kornakov
*Assistant Examiner* — Ryan L Coleman
(74) *Attorney, Agent, or Firm* — Patterson + Sheridan, LLP

(57) ABSTRACT

Methods and apparatus for removing a photoresist layer from a photomask substrate are provided. In one example, a method for removing a photoresist layer from a substrate in a chamber includes generating a first plasma including first radicals from a first gas mixture in a processing chamber, exposing a portion of a photoresist layer on a substrate to the first radicals to remove the portion of the photoresist layer from the substrate, generating a second plasma including second radicals from a second gas mixture, wherein the second radicals have a different composition than the first radicals, and exposing another portion of photoresist layer to the second radicals to remove the second portion of the photoresist layer.

15 Claims, 7 Drawing Sheets

(56) References Cited

U.S. PATENT DOCUMENTS

| | | |
|---|---|---|
| 7,673,637 B2 | 3/2010 | Pan |
| 2002/0197870 A1* | 12/2002 | Johnson .............. C23C 16/4586 |
| | | 438/689 |
| 2004/0195208 A1* | 10/2004 | Pavel ................ H01J 37/32963 |
| | | 216/59 |
| 2005/0183754 A1 | 8/2005 | Kago et al. |
| 2006/0144817 A1 | 7/2006 | Balasubramaniam et al. |
| 2007/0132989 A1 | 6/2007 | Kaller et al. |
| 2008/0102644 A1 | 5/2008 | Goto et al. |
| 2009/0098470 A1* | 4/2009 | Ha ........................... G03F 1/74 |
| | | 430/5 |
| 2013/0143406 A1 | 6/2013 | Hsu et al. |

* cited by examiner

METHOD FOR REMOVING PHOTORESIST FROM PHOTOMASK SUBSTRATE

CROSS REFERENCE TO RELATED APPLICATIONS

This application claims benefit of U.S. provisional patent application Ser. No. 62/833,469, filed on Apr. 12, 2019, which is incorporated by reference in its entirety.

BACKGROUND OF THE DISCLOSURE

Field of the Disclosure

The present disclosure relates to an apparatus and methods for removing photoresist and its residues from a substrate, particularly, a photomask.

Description of the Prior Art

In the manufacture of integrated circuits (IC), or chips, patterns representing different layers of the chip are created by a chip designer. A series of reusable masks, or photomasks, are created from these patterns in order to transfer the design of each chip layer onto a semiconductor substrate during the manufacturing process. Mask pattern generation systems use precision lasers or electron beams to image the design of each layer of the chip onto a respective mask. The masks are then used much like photographic negatives to transfer the circuit patterns for each layer onto a semiconductor substrate. These layers are built up using a sequence of processes and translate into the tiny transistors and electrical circuits that comprise each completed chip. Thus, any defects in the mask may be transferred to the chip, potentially adversely affecting performance. Defects that are severe enough may render the mask completely useless. Typically, a set of 15 to 30 masks is used to construct a chip and can be used repeatedly.

With the shrink of critical dimensions (CD), present optical lithography is approaching a technological limit at the 45 nanometer (nm) technology node. Next generation lithography (NGL) is expected to replace the conventional optical lithography method, for example, in the 32 nm technology node and beyond. There are several NGL candidates, such as extreme ultraviolet (EUV) lithography (EUVL), electron projection lithography (EPL), ion projection lithography (IPL), nano-imprint, and X-ray lithography. Among these, EUVL is the most likely successor due to the fact that EUVL has most of the properties of optical lithography, which is more mature technology as compared with other NGL methods.

Typically, one photomask, e.g., a reticle, may be repeatedly used to reproducibly print thousands of substrates. Typically, a photomask, e.g., a reticle, is typically a glass or a quartz substrate giving a film stack having multiple layers, including a light-absorbing layer and an opaque layer disposed thereon. When manufacturing the photomask, a photoresist layer is disposed on the film stack to facilitate transferring features into the film stack during the subsequent patterning processes. During the patterning process, the circuit design is written onto the photomask by exposing portions of the photoresist to extreme ultraviolet light or ultraviolet light, making the exposed portions soluble in a developing solution. The soluble portion of the resist is then removed, allowing the underlying film stack exposed through the remaining photoresist to be etched. The etch process removes the film stack from the photomask at locations where the resist was removed, i.e., the exposed film stack is removed.

During processing, endpoint data from the etching of the film stack for manufacturing photomasks is often used to determine whether the certain materials, such as a photoresist layer, is removed from the photomask. After the desired features are formed in the film stack, the photoresist layer is required to be removed from the photomask. When removing and/or cleaning the photoresist layer from the substrate, different reactive species are often required to effectively remove the photoresist layer. However, the actual amount of the reactive species which may travel to the surface of photomask for reaction are difficult to predict, which often results in incomplete photoresist removal with residues and/or particles remaining on the substrate. Such residues and/or particles often result in defects which may adversely affect transferring of the features to the substrate during the lithography process. In one example, in EUV lithography for 22 nm technology node, particles or residues as small as 18 nm must be removed and kept away from the photomask so as to pertain high transfer accuracy to the substrate for manufacturing integrated circuit.

Therefore, there is an ongoing need for improved photoresist cleaning and removal process in photomask fabrication.

SUMMARY OF THE DISCLOSURE

Methods and apparatus for removing photoresist layer from a photomask substrate are provided. In one example, a method for removing a photoresist layer from a substrate in a chamber includes generating a first plasma including first radicals from a first gas mixture in a processing chamber, exposing a portion of a photoresist layer on a substrate to the first radicals to remove the portion of the photoresist layer from the substrate, generating a second plasma including second radicals from a second gas mixture, wherein the second radicals have a different composition than the first radicals, and exposing another portion of photoresist layer to the second radicals to remove the second portion of the photoresist layer.

In another embodiment, a processing chamber includes a chamber lid and a chamber sidewall defining an interior processing region in a chamber body, a remote plasma source disposed on a chamber body, a window formed in the chamber sidewall, an OES detector disposed proximate to the window configured to collect signals generated in the interior processing region, and a gas generator coupled to the chamber sidewall.

In yet another embodiment, a computer readable storage medium storing a program, which, when executed by a processor performs an operation for operating a processing chamber, the operation includes collecting signals emitted from reactive species generated from a remote plasma source on a surface of a photomask substrate by an OES detector, analyzing the collected signals from the OES detector, and determining a photoresist removal recipe in response to the analysis of the collected signals from the OES detector.

BRIEF DESCRIPTION OF THE APPENDED DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

Figure 1:
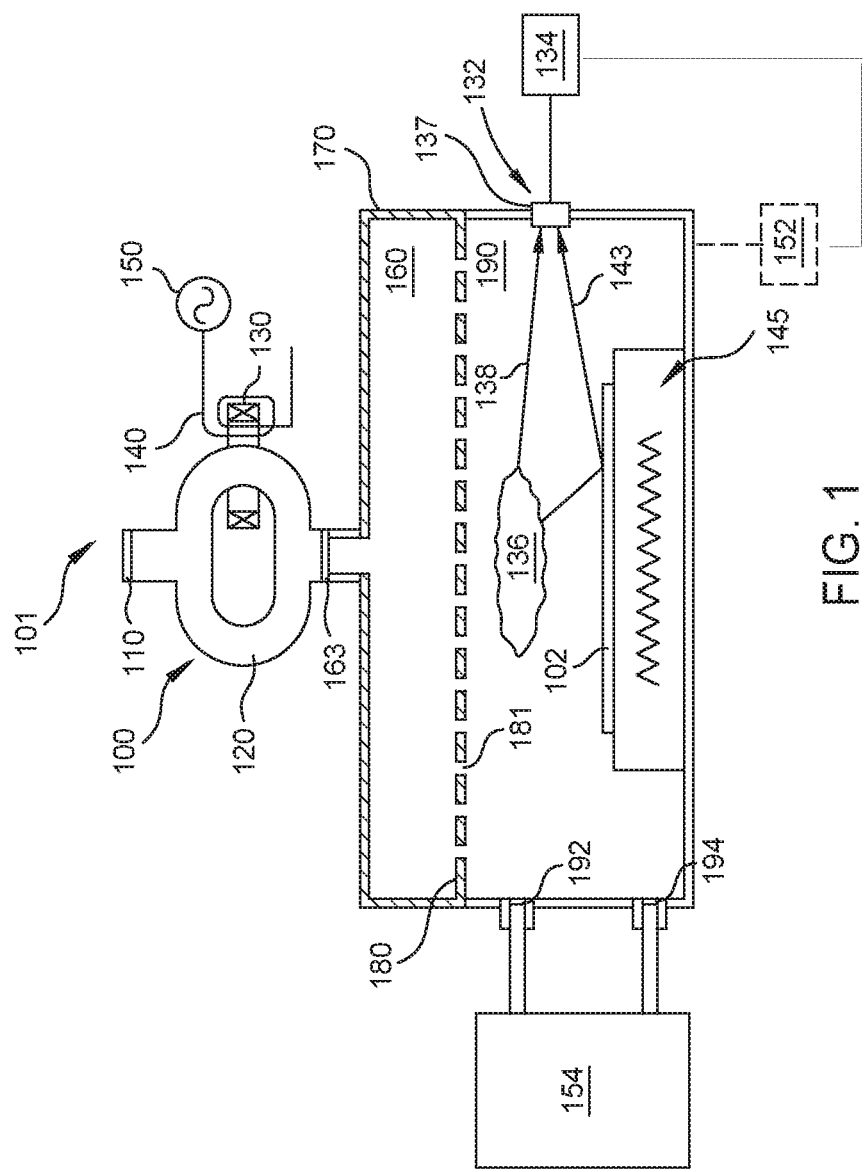
FIG. 1 depicts a pictorial representation of a processing chamber in accordance with one embodiment of the present disclosure.
Figure 5:
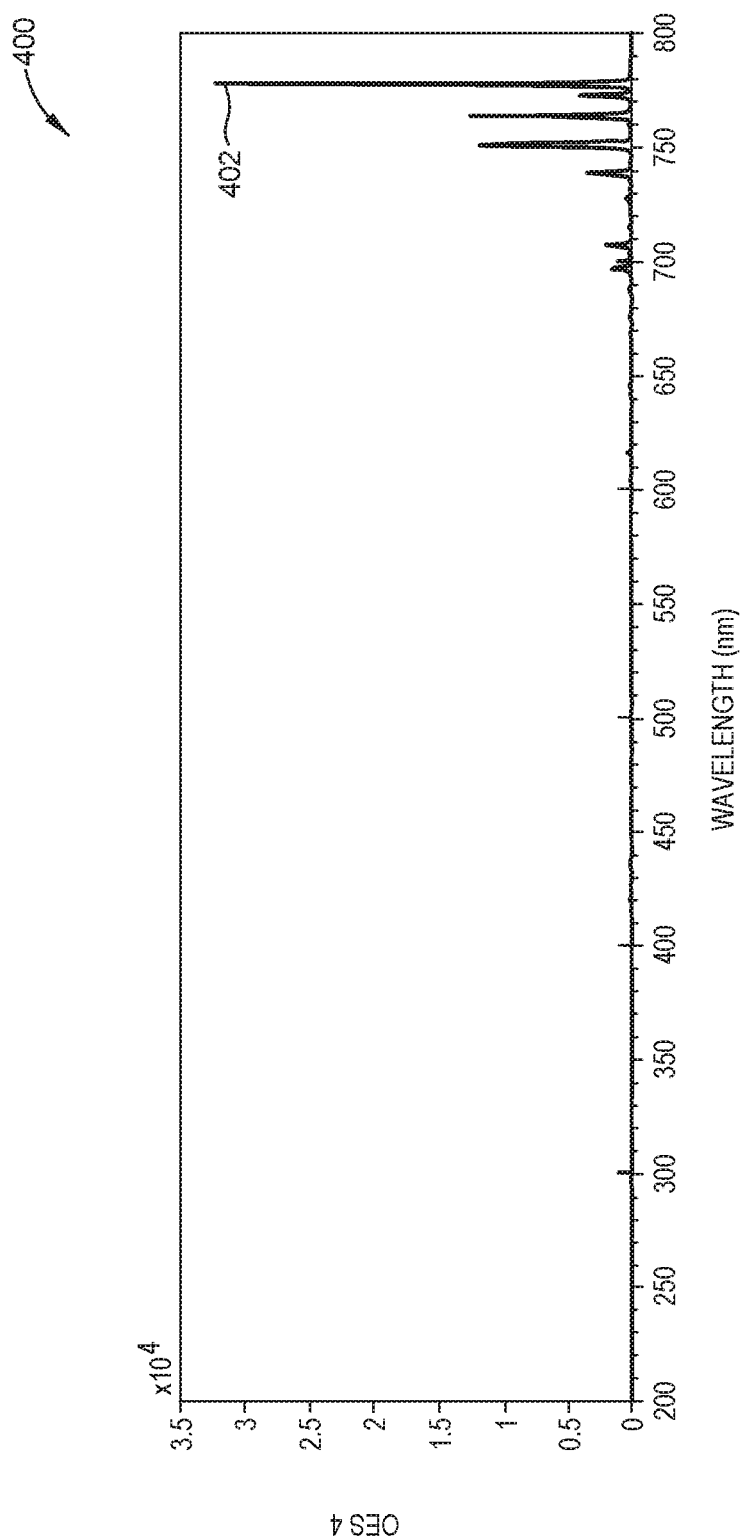
Figure 6:
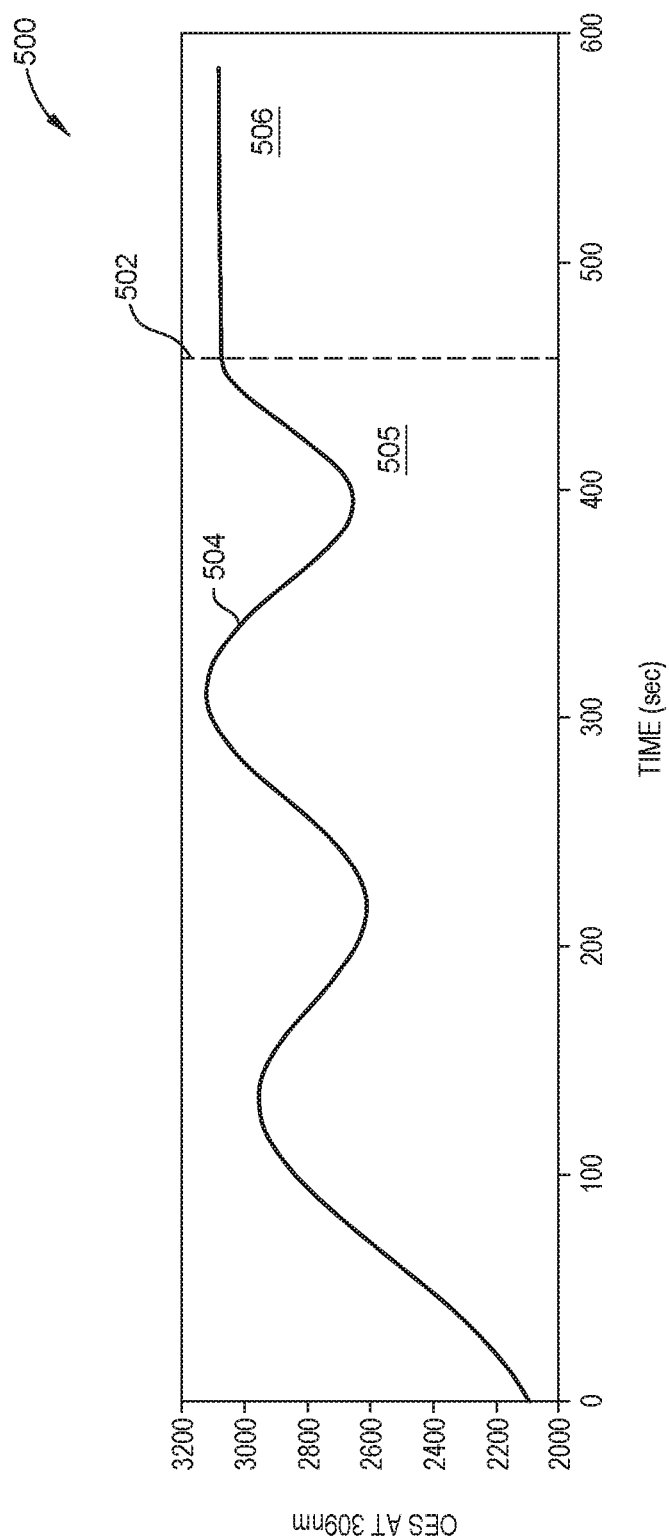
Figure 7:
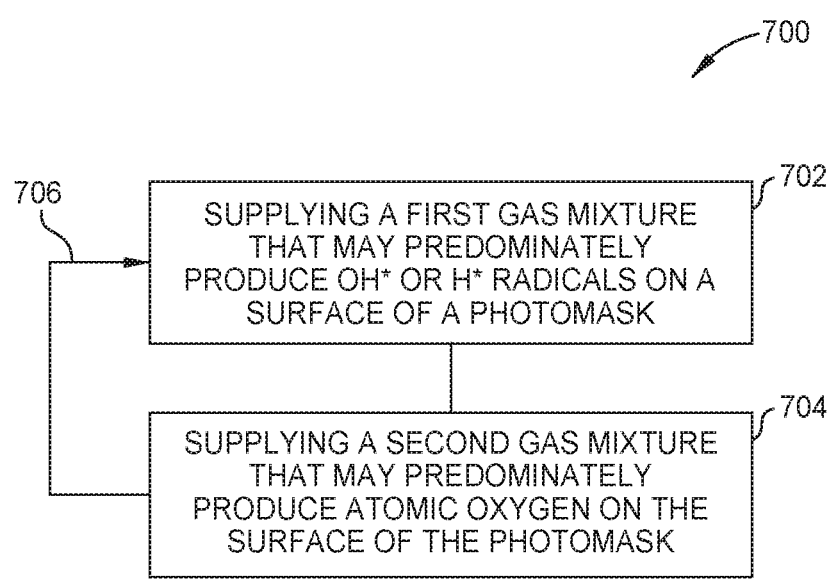

FIG. 5 depicts a plot of reactive species detected during a photoresist removal process performed in the processing chamber of FIG. 1; and FIG. 6 depicts a plot of optical signals detected for endpoint determination during a cleaning process performed in the processing chamber of FIG. 1; and FIG. 7 depicts a process flowchart of a method for photoresist removal process during a photomask manufacture process.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

The present disclosure provides an apparatus and methods for determining a recipe for a photoresist removal process with an enhanced process monitoring, removal efficiency and removal effectiveness. The photoresist removal process with the enhanced process monitoring may provide an estimate of the plasma state, such as the types of the reactive species or radicals, proximate to the surface of the photomask substrate, thus providing a good prediction of the surface reaction occurred during the photoresist removal process. As a result, a relatively accurate and precise endpoint may be detected/determined and a more efficient and effective cleaning process may be obtained.

FIG. 1 depicts a schematic view of a processing chamber 100 that may be utilized to perform a photoresist removal process, such as for removing a photoresist layer on a photomask. As shown in FIG. 1, the processing chamber 100 includes a remote plasma source 101 (e.g., a microwave or an RF energy-based source). A precursor gas, for example, $H_2O_2$, $H_2O$, $H_2$, $O_2$, and the like, is input through an entrance orifice 110 into a tube 120. In other embodiments, the precursor gas can also be, but not limited to, a mixture of $H_2O$ and Ar, a mixture of $O_2$, $N_2$, and $H_2O$, a mixture of $H_2O$ and $O_2$, a mixture of $H_2O$ and $O_3$, or any suitable combinations as needed.

The tube 120 is surrounded by a ferrite core 130, and wires 140 surround at least a portion of the ferrite core 130. RF energy supplied by an RF power supply 150 is inductively coupled to precursor gases flowing into and through the tube 120 to generate plasma therein. Plasma reactive species generated in the tube 120 flow through the exit tube 163, and enter the gas distribution plenum 160. As shown in FIG. 1, the exit tube 163 and gas distribution plenum 160 include liners 170 for reducing recombination of the plasma species generated by the remote plasma source 101. The gas distribution plate 180 having a plurality of apertures 181 forms a bottom portion of the gas distribution plenum 160. In one embodiment, the gas distribution plate 180 is a perforated plate or a showerhead, and as such, advantageously provides good flow uniformity of gas into the processing region 190. A plasma can also be generated in the processing region 190 as needed to enhance cleaning rates over those obtained by use of the remote plasma source 101 alone.

As further shown in FIG. 1, the processing chamber 100 includes a substrate pedestal 145. A substrate 102, such as a photomask or a reticle, is transferred into and out of the processing region 190 by a robot arm from/to a transfer chamber (not shown). In the cleaning process, the substrate pedestal 145 heats the substrate 102 to promote reaction of the photoresist layer on the substrate to react with the reactive species from the remote plasma source 101, converting into volatile compounds which may be pumped out of the processing chamber 100. Further, the reactive species in the plasma generated by the remote plasma source 101 can promote the conversion of the outgassed reactants into non-corrosive volatile compounds, thus increasing the removal efficiency of the residues from the substrate 102.

According to one embodiment of the disclosure, the remote plasma source 101 provides the plasma while the substrate 102 is heated. Subsequently, the substrate 102 is exposed to the reactive species (e.g., radicals) from the plasma. In other words, the heat-up of the substrate 102 and remote plasma generation may be performed simultaneously. For instance, the remote plasma can be struck when the substrate pedestal 145 starts to heat the substrate 102. Subsequently, the plasma is maintained in part or all of the duration when the substrate pedestal 145 heats the substrate 102. In this way, the photoresist cleaning efficiency can be improved in comparison with that obtained when the heat-up and remote plasma generation are performed separately. Thus, the photoresist removal process will take less time and the manufacturing throughput of the semiconductor processing system will not be reduced.

As the gas distribution plate 180 may assist filtering out some types of the species, the amount and types of the reactive species actually reach to the surface of the substrate 102 are often hard to predict. Thus, the amount and types reactive species that can travel to the substrate surface and actively react with the photoresist layer on the substrate 102 to form non-corrosive volatile compounds are often difficult to estimate, thus often resulting in under-reaction, which may leave undesired residues, or over-reaction, which may cause substrate damage, during the photoresist cleaning process. Thus, sensors and/or detectors 134, such as an optical emission spectroscopy (OES), are often utilized to detect the reactive species distributed across the surface of the substrate 102 for photoresist removal efficiency enhancement.

The OES detector 134 comprises optical setup for operating in at least one of reflection, interferometry or transmission modes, and is configured for different types of measurements such as reflectance or transmittance, interferometry, or optical emission spectroscopy. Depending on the application of interest, e.g., the material layers or substrate structure being processed, signals may be detected based on a change in the reflectance or transmittance intensities, the number of interference fringes, or changes in optical emission intensities at specific wavelengths, or a combination thereof. In one particular embodiment depicted therein, the OES detector 134 is configured to detect a signal on a change in the reflectivity reflected through the substrate surface and/or transmittance transmitted from the reactive species from the plasma as generated.

In operation, sensors and/or detectors 134, such as an optical emission spectroscopy (OES), may transmit signals to the controller, such as the controller 152 depicted in FIG. 1, for the analysis so as to match thereof to a desired value setting. The OES detector 134 may receive signals 138 transmitted from the reactive species 136 (e.g., radicals from the plasma) to monitor the chamber radical state. Thus, the OES detector 134 is configured to be positioned with a step height horizontally above a top surface of the substrate pedestal 145 so that the reactive species 136 generated above the top surface of the substrate pedestal 145 may be properly collected, detected and transmitted to the OES detector 134. The OES detector 134 can be used to determine the state, types, intensities and amount of the reactive species close to the surface of the substrate 102. Furthermore, the OES detector 134 may also receive signals 143 reflected from the surface of the substrate 102 so that a surface condition may also be determined upon analyzing the reflected signals 143. Based on the collected signals, an endpoint for the photoresist removal process may be determined. The analyzed results, both from analyzing the reactive species signals 138 and/or the reflected signals 143, provide a close-to-true state of the reactive species distributed on the surface of the substrate 102 so that an effective and efficient photoresist removal recipe may be determined and an accurate endpoint may also be determined.

In the example depicted in FIG. 1, the signal 138 and the reflected signal 143 passes through a window 137 to be collected by the OES detector 134. The window 137 may be fabricated by suitable transparent materials, such as synthetic quartz or fused silica. The OES detector 134 then analyzes the signals 138, 143 and determines the types of the reactive species in the processing region 190, which are close to the surface of the substrate 102, and the amount of the photoresist layer remained on the substrate 102. Such analyzed data may be further transmitted to the controller 152 so as to compute and real-time or offline determine a photoresist removal recipe that may be utilized to enhance the photoresist removal efficiency on the substrate 102 as needed. Details of how to operate the OES detector 134 to determine a cleaning recipe for the photoresist removal process will be further discussed below.

Furthermore, the processing chamber 100 also includes a gas generator 154, such as a high concentration ozone generator, for controlling the pressure in the processing chamber 100 by venting or evacuating the processing chamber 100 through the orifices 192/194 formed on the chamber wall. The high concentration ozone generator 154 may assist maintaining the pressure of the processing region 190 at a desired range, as well as supplying ozone ($O_3$) gas to the processing region 190 during the photoresist removal process to assist removing photoresist residues as needed. In one example, the gas generator 154 is positioned opposite to the OES detector 134. In one embodiment, a relatively higher pressure range may be utilized to assist heat transfer in the processing region 190 so that the reactive species as well as the residues on the substrate surface may be driven off at a higher pressure. Thus, while the substrate 102 is heated during the photoresist removal process, raising the pressure in the processing region 190 may enhance the removal efficiency.

The controller 152 is coupled to the process chamber 100. The controller 152 includes a central processing unit (CPU), a memory, and support circuits. The controller 152 is utilized to control the process sequence, regulating the gas flows from the remote plasma source 101 into the processing region 190. The CPU in the controller 152 may be of any form of a general purpose computer processor that can be used in an industrial setting. The software routines can be stored in the memory, such as random access memory, read only memory, floppy or hard disk drive, or other form of digital storage. The support circuits are conventionally coupled to the CPU and may comprise cache, clock circuits, input/output subsystems, power supplies, and the like. The software routines, when executed by the CPU, transform the CPU into a specific purpose computer (controller) 152 that controls the processing chamber 100 such that the processes are performed in accordance with the present disclosure. The software routines may also be stored and/or executed by a second controller (not shown) that is located remotely from the chamber 100.

Figure 2:
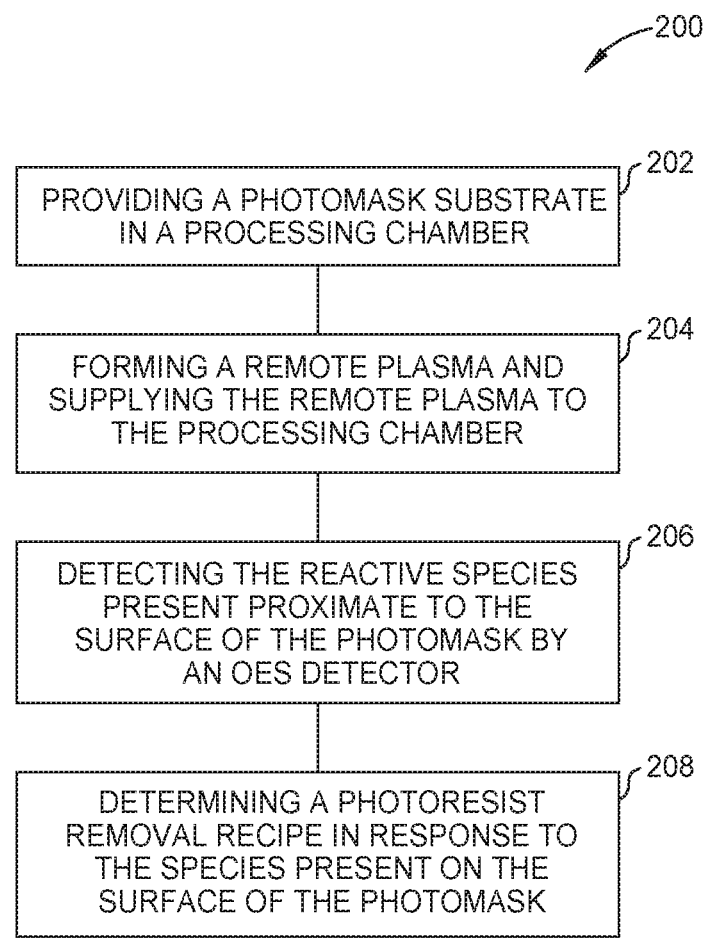
FIG. 2 depicts a process flowchart of a method for determining a cleaning recipe for use in the processing chamber of FIG. 1.

FIG. 2 illustrates the flowchart of a method 200 for removing a photoresist layer along with its residues from a substrate in a processing chamber according to one embodiment of the disclosure. The method 200 can be configured to perform in the processing chamber 100 described in FIG. 1. It is contemplated that the method may be performed in other suitable semiconductor processing chambers and systems, including those from other manufacturers.

Figure 3A:
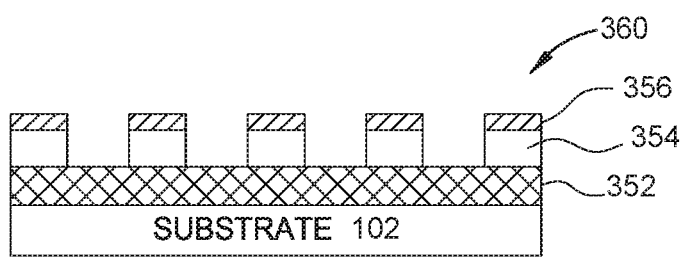
FIG. 3A-3B illustrate schematically structures of one embodiment of the photomask substrate during the method of FIG. 2.

The method 200 begins at operation 202 by providing a substrate 102, such as a photomask, on a processing chamber, such as the processing chamber 100 depicted in FIG. 1. The substrate 102 often includes a film stack 360 having a patterned photoresist layer 356 on the photomask substrate 102, as shown in FIG. 3A. The film stack 360 often includes at least an absorber layer 354 and a phase shift mask layer 352 disposed on the photomask substrate 102. In one embodiment, the photomask substrate 102 includes an optically transparent silicon based material, such as quartz or low thermal expansion glass layer having the absorber layer disposed thereon defined by the patterned photoresist layer 356. In one embodiment, the phase shift mask layer 352 may be disposed between the photomask substrate 102 and the absorber layer 354 as needed.

In one embodiment, the photomask substrate 102 has a rectangular shape having sides between about 5 inches to about 9 inches in length. The photomask substrate may be between about 0.15 inches and about 0.25 inches thick. In one embodiment, the photomask substrate 102 is about 0.25 inches thick. The absorber layer 354 may be a metal containing layer, e.g., a chromium containing layer, such as a Cr metal, chromium oxide ($CrO_x$), chromium nitride (CrN) layer, chromium oxynitride (CrON), or multilayer with these materials, as needed. The phase shift mask layer 352 may be a molybdenum containing layer, such as Mo layer, MoSi layer, MoSiN, MoSiON, and the like. The patterned photoresist layer 356 is formed over the absorber layer 354 having openings. In the example depicted in FIG. 3A, the portion of the absorber layer 354 has been etched, exposing some portions of the phase shift mask layer 352. The remaining photoresist layer 356 is intended to be removed during the photoresist removal process at method 200. The photoresist layer 356 may be any suitable photosensitive resist materials, such as an e-beam resist (for example, a chemically amplified resist (CAR)), and deposited and patterned in any suitable manner. The photoresist layer 356 may be deposited to a thickness between about 50 nm and about 1000 nm.

At operation 204, a remote plasma is generated from the remote plasma source and then delivered to the processing region 190 to perform a photoresist removal process. The remote plasma is generated from a first gas mixture including an oxygen containing gas. In the meanwhile, the substrate 102 may be heated as needed. The reactive species from the remote plasma is configured to react with the photoresist layer 356 so as to remove the photoresist layer 356 on the photomask substrate 102.

During the removal of the photoresist layer 356, the reactive species (e.g., radicals) as generated is monitored either in reflection or transmission mode. In one embodiment, the oxygen containing gas in the first gas mixture, such as $O_2$, $H_2O$, $H_2O_2$, $O_3$, $CO_2$, and the like, is used for remove the photoresist layer 356 of the photomask substrate 102. In one example, a hydrogen-based gas, such as $H_2O$ gas is used to generate remote plasma that provides reactive species, which may then be fallen onto the surface of the photomask substrate 102 to react and remove the photoresist layer 356.

At operation 206, while removing the photoresist layer 356, the plasma is utilized as a light source to be collected by the OES detector 134. The radicals generate electromagnetic emissions having wavelengths primarily in the optical spectrum (e.g., from about 180 to 1100 nanometers), although both ultra-violet and infrared wavelengths also may result. A portion of these electromagnetic emissions (e.g., the electromagnetic emissions) provide the signal 138 travels through the viewport 132 provided by the window 137 and reach the OES detector 134. It is noted that signal 138 from the electromagnetic emissions typically comprise many more wavelengths.

Figure 4:
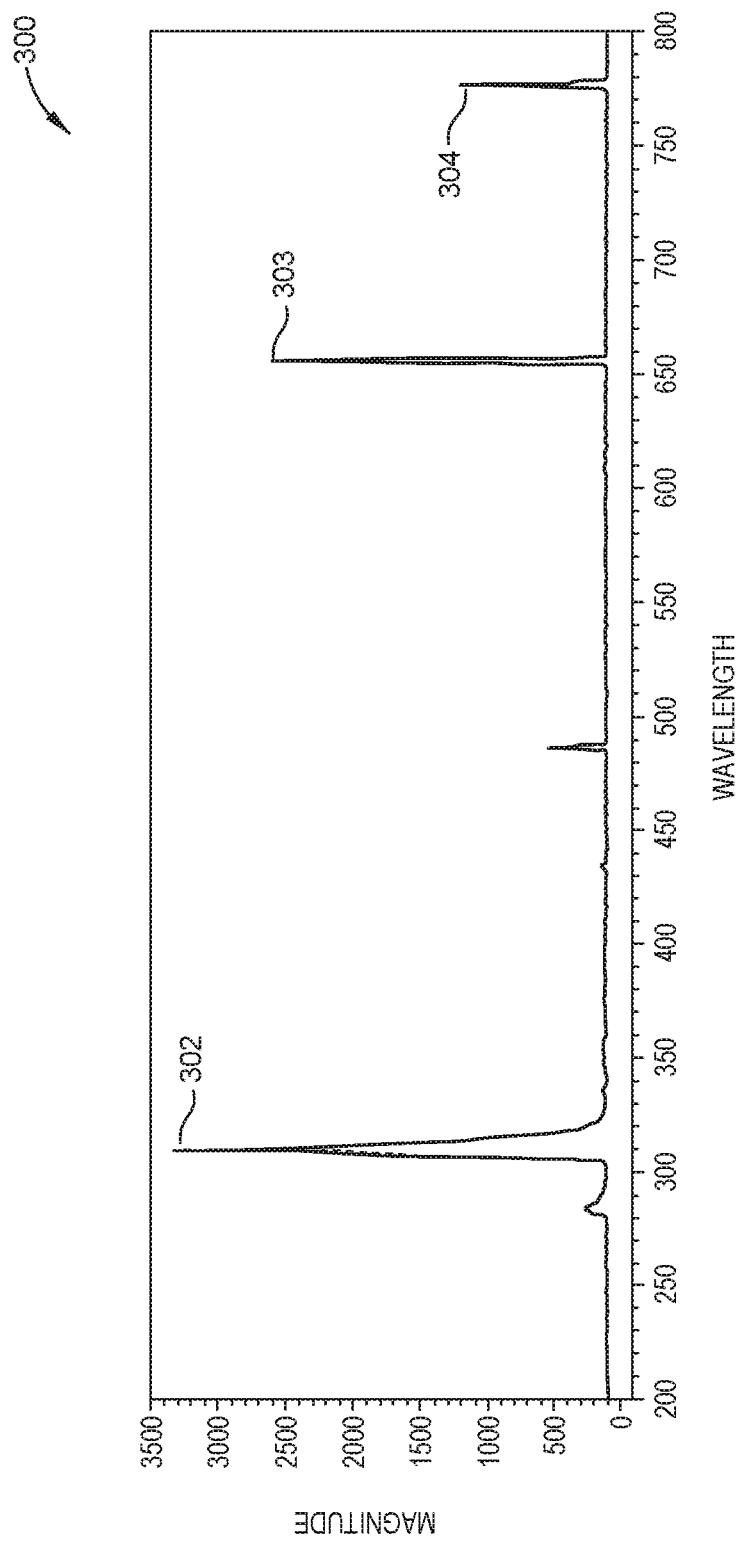
FIG. 4 depicts a plot of reactive species detected during a photoresist removal process performed in the processing chamber of FIG. 1.

FIG. 4 depicts a plot of an output 300 from the OES detector 134 illustrating an intensity of different species supplied using $H_2O$ precursor from the remote plasma source 101. In the example depicted in FIG. 4, a first high peak intensity 302 at a wavelength around 300 nm (e.g., about 309 nm) is detected, indicating that a great amount of OH species are present. Furthermore, a second high peak intensity 303 is also detected at a wavelength around 660 nm (e.g., about 656 nm), indicating that a great amount of H species (e.g., but less than OH species) are present. A third peak intensity 304 is also detected at a wavelength around 770 nm (e.g., about 777 nm), indicating that a small amount of O species are present. It is believed that by utilizing relatively high OH species (e.g., OH rich environment) during the photoresist removal process, an efficient and higher removal rate may be obtained as OH species can effectively react with the carbon and/or silicon elements from the bulk photoresist layer 356.

In contrast, FIG. 5 depicts a plot 400 of an output from the OES detector 134 illustrating an intensity of different species using $O_2$ precursor from the remote plasma source 101 or from the gas generator 154. In this plot 400, the reactive species has a high peak intensity 402 at wavelength around 770 nm (e.g., about 777 nm), indicating that a great amount of atomic oxygen species are present close to the surface of the photomask substrate 102. It is believed that atomic oxygen species may serve as a strong oxidizing agent to oxidize the carbon containing residues remained on the substrate surface, so as to assist cleaning the left-over carbon residues from the substrate surface.

Furthermore, FIG. 6 depicts a waveform 504 plotted as a function of time corresponding to the varying intensity of the reflected signal 143 over time reflected from the surface of the photomask substrate 102. The waveform 504 is analyzed to determine an endpoint for the photoresist layer 356 from the substrate 102. In one embodiment, the wavelength of the waveform 504 is obtained at a light wavelength at between about 200 nm and about 800 nm, such as about 309 nm. The waveform patterns are often different at other wavelengths. Collecting a spectrum of wavelengths will provide numerous waveform patterns. The signal 143 is detected real-time when the photoresist layer 356 is removed in the processing chamber 100. With the consumption of the photoresist layer 356 during photoresist removal process, the intensity of the reflected signal 143 changes overtime. The time-varying intensity of waveform 504 at particular wavelengths is then analyzed to determine at least one of the depth of the photoresist layer being removed, the removal rate and the end point of the photoresist removal process. In the embodiment depicted in FIG. 6, the intensity of the reflected signal 143 is continuously varied over a first time period 505 until becoming saturated at a second time period 506. When the intensity of the reflected signal 143 is saturated and at a steady state for the second time period 506, it indicates the photoresist layer 356 has been removed away, thus determining a time point 502 as the proper endpoint for removing the photoresist layer 356 from the substrate 102.

Figure 3B:
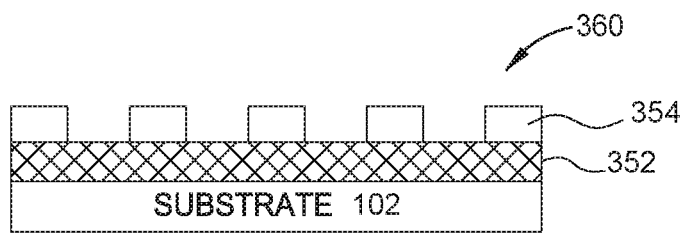

At operation 208, as discussed above, based on the types and amount of the reactive species detected on the surface of the photoresist layer 356, as well as the endpoint determined thereupon, a photoresist removal recipe (e.g., a photoresist cleaning recipe) may be determined or adjusted accordingly. For example, types of the precursor gases supplied during the photoresist removal process, process parameters, such as RF power setting, process pressure, or other parameters, may also be adjusted or changed in response to the types and amount of the reactive species as detected by the OES detector. Thus, by detecting and analyzing the signals collected by the OES detector 134, the types of the reactive species present on the surface of the photomask substrate 102 may be obtained and understood, so as to adjust and/or compile a photoresist removal recipe that has high effective removal efficiency. Furthermore, an endpoint of the photoresist removal process may also be obtained accordingly so that a relatively clean surface without photoresist residue may be obtained after the photoresist layer 356 is removed from the photomask substrate 102, as shown in FIG. 3B.

In the example depicted in the method 200 of FIG. 2, a second or third gas mixture may be supplied during different removal stages of the photoresist removal process so as to enhance the cleaning efficiency. The types of the gas species and the process parameters may be determined by the analyzed data from operation 208.

Thus, by utilizing the OES detector, the state of the reactive species and/or plasma close to the surface of the photomask substrate may be obtained so as to determine suitable process precursors from the remote plasma source that may efficiently remove the photoresist layer from the photomask substrate. Although the embodiments depicted herein provide using the plasma as a energy source for OES detection, it is noted that other types of the energy source may also be utilized as needed.

FIG. 7 depicts one embodiment of a photoresist removal recipe that is determined based on the previously measured and detected signals from the OES detector 134 implemented in the processing chamber 100.

At operation 702, after a photomask substrate is transferred into the processing chamber, a first gas mixture is supplied from the remote plasma source 101 to the processing region 190 for photoresist layer removal. Based on the collected signal analysis from the OES detector, it is believed that OH* species generated from water vapor, e.g., $H_2O$ gas, provides a good bulk photoresist layer removal efficiency. Thus, the first gas mixture supplied to the remote plasma source 101 includes at least a $H_2O$ gas. In some embodiment, H* species are also selected to enhance the photoresist removal efficiency. Thus, $H_2$ gas or other suitable hydrogen containing gas may also be utilized in the first gas mixture.

At operation 704, a second gas mixture may be supplied to continue removing the photoresist layer from the substrate. While supplying the second gas mixture, the first gas mixture may be terminated as needed. In one example, the second gas mixture includes an oxygen containing gas, such as $O_3$, $O_2$ and the like, to provide atomic oxygen species to react with the photoresist residues from the photomask substrate surface. It is believed that the atomic oxygen species may assist oxidizing the residues from the substrate surface, forming CO or $CO_2$ in gas phase which may be readily pumped out of the processing chamber. Thus, by using different gas mixtures at different stages of the photoresist removal process, a photoresist removal process with enhanced removal efficiency may be obtained. It is noted that the first and the second gas mixture may be supplied in any order, such as in reversed order (e.g., performing the operation 704 prior to performing the operation 702), as needed. In some examples, the first gas mixture and the second gas mixture may be repeated supplied, as indicated at loop 706, to enhance the removal efficiency as needed.

As described above, the present disclosure provides methods and systems for removing a photoresist layer with enhanced removal efficiency from a substrate. By utilizing an OES detector in a processing chamber to monitor the reactive specie state close to the photomask substrate surface, a more accurate endpoint determination of the photoresist removal process as well as enhanced removal efficiency with desired surface cleanliness may be obtained.

While the foregoing is directed to embodiments of the present disclosure, other and further embodiments of the disclosure may be devised without departing from the basic scope thereof, and the scope thereof is determined by the claims that follow.

What is claimed is:

1. A method for removing a photoresist from a substrate in a chamber, comprising:
   generating a first plasma including first radicals from a first gas mixture supplied into a processing chamber;
   exposing a first portion of the photoresist to the first radicals to remove the first portion of the photoresist from the substrate;
   collecting a first signal at an OES detector, after exposing the first portion;
   adjusting the first gas mixture supplied into the processing chamber based upon types of first radicals detected from the first signal;
   generating a second plasma including second radicals from a second gas mixture supplied into the processing chamber, wherein the second radicals have a different composition than the first radicals;
   exposing a second portion of the photoresist to the second radicals to remove the second portion of the photoresist from the substrate, wherein the second portion is a residual of the first portion;
   collecting a second signal at the OES detector, after exposing the second portion;
   adjusting the second gas mixture supplied into the processing chamber;
   generating a first endpoint based upon an intensity of the first signal;
   generating a second endpoint based upon an intensity of the second signal; and
   removing the first portion based upon the first endpoint, and removing the second portion based upon the second endpoint.

2. The method of claim 1, wherein the first gas mixture comprises at least one of $H_2$, $H_2O_2$, $H_2O$ or $O_2$ gas.

3. The method claim 1, wherein the second gas mixture comprises $O_3$ gas or $O_2$ gas.

4. The method of claim 3, wherein the second gas mixture comprises an oxidizing agent.

5. The method of claim 1, wherein generating the first plasma further comprises:
   collecting reflected signals at the OES detector, the reflected signals being reflected from a surface of the substrate.

6. The method of claim 5, further comprising:
   analyzing data from the reflected signals prior to removing the first portion or the second portion of the photoresist.

7. The method of claim 5, further comprising:
   adjusting a precursor gas supplied in the first gas mixture or the second gas mixture in response to analyzed data from the collected first or second signals.

8. The method of claim 5, further comprising:
   adjusting a process pressure when supplying the first gas mixture or the second gas mixture in response to analyzed data from the collected first or second signals.

9. The method of claim 5, further comprising:
   determining a photoresist removal recipe in response to analyzed data from the collected first or second signals.

10. The method of claim 1, further comprising:
    terminating the first gas mixture while supplying the second gas mixture.

11. A computer-readable storage medium storing a program, which, when executed by a processor performs an operation for operating a processing chamber, the operation comprising:
    collecting first signals at an OES detector, the first signals emitted from a surface of a photomask substrate during removal of a first portion of photoresist from the photomask substrate;
    analyzing the collected first signals to determine a state of a first reactive species distributed across the surface of the photomask substrate;
    determining a first photoresist removal recipe in response to the analysis of the collected first signals, wherein the first photoresist removal recipe includes adjusting a first gas mixture used to perform plasma etching of the first portion, and wherein the first photoresist removal recipe includes a first endpoint; and
    collecting second signals at the OES detector, the second signals emitted during removal of a second portion of photoresist from the photomask substrate, wherein the second portion is a residual of the first portion;
    analyzing the collected second signals to determine a state of a second reactive species distributed across the surface of the photomask substrate;
    determining a second photoresist removal recipe in response to the analysis of the collected second signals, wherein the second photoresist removal recipe includes adjusting a second gas mixture used to perform etching of the second portion, and wherein the second photoresist removal recipe includes a second endpoint;

determining a first endpoint based upon an intensity of the first signals;

determining a second endpoint based upon an intensity of the signals; and removing the first portion based upon the first endpoint and removing the second portion based upon the second endpoint.

12. The computer-readable storage medium of claim 11, wherein the operation further comprises:

supplying more than one gas precursor to the surface of the photomask substrate after analyzing the first signals or the second signals.

13. The computer-readable storage medium of claim 12, wherein the operation further comprises:

supplying a first gas precursor comprising $H_2O$ in the first gas mixture; and supplying a second gas precursor comprising $O_2$ in the second gas mixture.

14. The computer-readable storage medium of claim 13, wherein the second gas precursor predominately reacts with residues from the first portion disposed on the photomask substrate.

15. The computer-readable storage medium of claim 11, wherein the operation further comprises:

terminating the first gas mixture while supplying the second gas mixture.

* * * * *